(12) United States Patent
Cohen

(10) Patent No.: US 9,484,900 B2
(45) Date of Patent: Nov. 1, 2016

(54) DIGITAL-TO-PHASE CONVERTER

(71) Applicant: QUALCOMM Incorporated, San Diego, CA (US)

(72) Inventor: Hanan Cohen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/535,744

(22) Filed: Nov. 7, 2014

(65) Prior Publication Data

US 2016/0134266 A1   May 12, 2016

(51) Int. Cl.
*H03H 11/16*  (2006.01)
*H03K 5/135*  (2006.01)
*H03L 7/00*  (2006.01)
*H03L 7/081*  (2006.01)
*H03K 5/00*  (2006.01)

(52) U.S. Cl.
CPC ............... *H03K 5/135* (2013.01); *H03L 7/00* (2013.01); *H03L 7/0812* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 6,239,661 B1 * | 5/2001 | Ali | ........................... | H03B 5/20 327/238 |
| 7,620,133 B2 | 11/2009 | Cafaro et al. | | |
| 8,400,196 B2 | 3/2013 | Kim | | |
| 8,615,205 B2 * | 12/2013 | Choksi | ................... | H03D 3/009 455/115.1 |
| 8,718,574 B2 * | 5/2014 | Panikkath | ................. | H03L 7/08 455/86 |
| 8,824,616 B1 | 9/2014 | Gopalakrishnan | | |
| 2008/0238515 A1 * | 10/2008 | Kim | ....................... | H03B 27/00 327/254 |
| 2009/0195286 A1 | 8/2009 | Rylov | | |
| 2009/0245420 A1 * | 10/2009 | Hausmann | ............ | H04L 27/362 375/298 |
| 2010/0109734 A1 | 5/2010 | Rylov | | |
| 2010/0128820 A1 * | 5/2010 | Ko | ....................... | H04L 27/2273 375/330 |
| 2010/0246724 A1 * | 9/2010 | Park | .................... | G06K 19/0723 375/340 |
| 2010/0329403 A1 | 12/2010 | Beukema et al. | | |
| 2011/0241746 A1 | 10/2011 | Fu | | |
| 2012/0187994 A1 * | 7/2012 | Yang | ..................... | H03L 7/0812 327/233 |
| 2013/0207707 A1 | 8/2013 | Agrawal et al. | | |

(Continued)

OTHER PUBLICATIONS

Sidiropoulos S., et al., "A Semidigital Dual Delay-Locked Loop", IEEE Journal of Solid-State Circuits, vol. 32, No. 11, Nov. 1997, pp. 1683-1692.

(Continued)

*Primary Examiner* — Cassandra Cox
(74) *Attorney, Agent, or Firm* — Procopio, Cory, Hargreaves & Savitch LLP

(57) ABSTRACT

Systems and methods for converting digital signals into clock phases are disclosed. An example digital-to-phase converter circuit receives a complementary in-phase and quadrature clock signals and produces four clock outputs at a phase controlled by a digital phase control input. The digital-to-phase converter uses first and second pre-driver modules to buffer the -phase and quadrature clock signals and produce corresponding buffered clock signals having controlled slew rates. Mixer modules produce the clock outputs by forming weighted combinations of the buffered clock signals. The weighting is determined based on the phase control input. The controlled slew rates of the buffered clock signals allow digital mixer module to provide accurate phase control. The digital-to-phase converter may also include an output buffer that compensates for nonlinearities in the relationship between the phases of the clock outputs and the phase control input.

24 Claims, 8 Drawing Sheets

(56) References Cited

U.S. PATENT DOCUMENTS

2014/0086364 A1 3/2014 Schell et al.
2014/0146932 A1 5/2014 Song
2014/0211898 A1 7/2014 Katoh

OTHER PUBLICATIONS

International Search Report—PCT/US2015/054256—ISA/EPO—Jan. 15, 2016.

* cited by examiner

DIGITAL-TO-PHASE CONVERTER

BACKGROUND

1. Field

The present invention relates to electronic circuits and, more particularly, to electronic circuits for converting a digital signal to a clock phase.

2. Background

The use of high-speed serial communication links in electronic systems continues to grow. High-speed serial communication links can operate according to various standards such as USB, HDMI, SATA, and PCIe. A serializer/deserializer (SERDES) transmits and receives data from a serial communication link.

FIG. 1 is a functional block diagram of a deserializer (also referred to as a clock and data recovery circuit or CDR). The deserializer is a "half-rate" design in which the frequency of the clock signals is one-half the data rate.

A sampler module 111 samples received data (RX) based on sampling clock signals $\Phi 0$, $\Phi 90$, $\Phi 180$, $\Phi 270$ from a digital-to-phase converter 121. The sampling clock signals may be referred to as 0-, 90-, 180-, 270-degree clock signals according to their relative timing. The digital-to-phase converter 121 (also referred to as a phase interpolator) produces the sampling clock signals by interpolating from in-phase and quadrature clock signals (I/Q CLOCKS) (e.g., received from a PLL). The in-phase and quadrature clock signals are differential (complementary) signals with the quadrature clock signal shifted 90 degrees from the in-phase clock signal. The digital-to-phase converter 121 produces the sampling clock signals with a phase (relative to the in-phase and quadrature clock signals) based on a phase control (PHASE) from a loop filter module 131.

The loop filter module 131 uses the sampled received data from the sampler module 111 to produces the phase control. The loop filter module 131 generally operates to place the 0 and 180 degree sampling clock signals on the centers of the received data and the 90 and 270 degree sampling clock signals on the edges of the received data. The 0-degree and 180-degree clock signals can then be used to sample the received data signal to produce the recovered data, and the 90-degree and 270-degree clock signals can be used to sample the received data signal with the samples used for timing recovery.

A data deserializer module 141 converts data samples from the sampler module 111 from serial to parallel format. For example, the data deserializer module 241 may combine five sets of samples of the received data signal that were sampled using the 0 degree and 180 degree clock signals to produce a 10-bit parallel output (DATA).

Prior digital-to-phase converters use current-mode logic (CML) but other circuits (including samplers and PLLs) may use complementary-metal oxide semiconductor (CMOS) logic. Thus, CML-to-CMOS converters are used on the inputs and CMOS-to-CML converters are used on the outputs. The converters can be complex to design and expensive to manufacture. Further, CML circuits do not scale well with shrinking fabrication technology. Additionally, prior digital-to-phase converters can be inaccurate and have a nonlinear relationship between the phase control and the phase of the sampling clock signals.

SUMMARY

In one aspect, a digital-to-phase converter circuit for producing a clock output having a digitally controlled phase is provided. The circuit includes: a first pre-driver module configured to receive complementary in-phase clock signals and produce a first pair of complementary buffered clock signals having controlled slew rates; a second pre-driver module configured to receive complementary quadrature clock signals and produce a second pair of complementary buffered clock signals having controlled slew rates; and a mixer module configured to produce the clock output by forming a weighted combination of the buffered clock signals based on a phase control input.

In one aspect, a method for producing a clock output having a digitally controlled phase is provided. The method includes: buffing in-phase clock signals to produce a first pair of complementary buffered clock signals having controlled slew rates; buffering quadrature clock signals to produce a second pair of complementary buffered clock signals having controlled slew rates; and forming a weighted combination of the buffered clock signals to produce the clock output, wherein the weighted combination is selected to produce the digitally controlled phase.

In one aspect, an apparatus for producing a clock output having a digitally controlled phase is provided. The apparatus includes: a means for driving a first pair of complementary buffered clock signals configured to receive complementary in-phase clock signals and produce the first pair of complementary buffered clock signals having controlled slew rates; a means for driving a second pair of complementary buffered clock signals configured to receive complementary quadrature clock signals and produce the second pair of complementary buffered clock signals having controlled slew rates; and a means for mixing configured to produce the clock output by forming a weighted combination of the buffered clock signals based on a phase control input.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
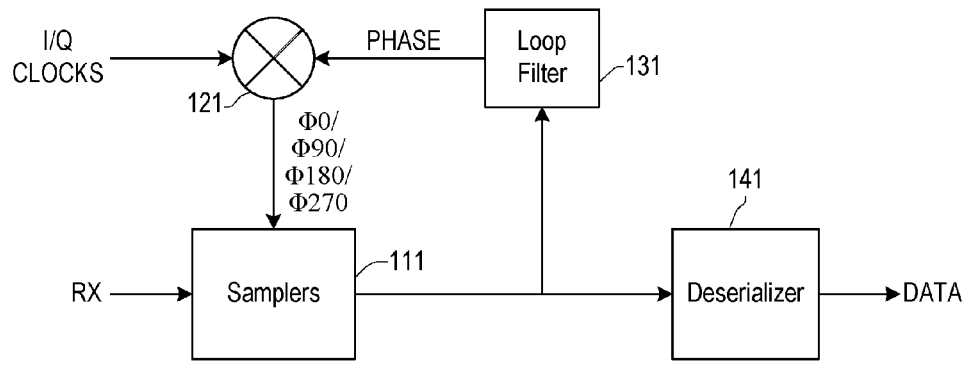
FIG. 1 is a functional block diagram of a deserializer.
Figure 2:
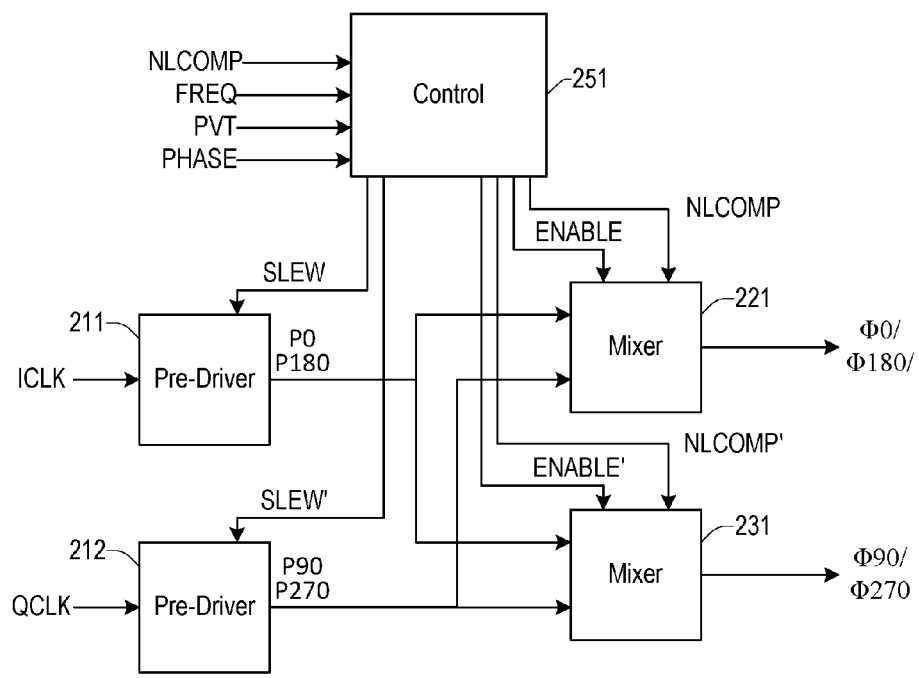
FIG. 2 is a functional block diagram of a digital-to-phase converter according to a presently disclosed embodiment.

FIG. 2 is a functional block diagram of a digital-to-phase converter according to a presently disclosed embodiment. The digital-to-phase converter may, for example, implement the digital-to-phase converter 121 of the deserializer of FIG. 1.

The digital-to-phase converter of FIG. 2 receives in-phase clock inputs ICLK and quadrature clock inputs QCLK. The in-phase and quadrature clock inputs are differential (complementary) signals with the quadrature clock inputs shifted 90 degrees from the in-phase clock inputs. The digital-to-phase converter produces four clock outputs Φ0, Φ90, Φ180, Φ270 that are spaced by 90 degrees. The clock outputs have the same period as the clock inputs and have a phase controlled by a phase control input PHASE. The phase of the clock outputs is relative; for example, for a phase control value of 0, the phase of the 0-degree clock output Φ0 corresponds to the phase of the in-phase clock input ICLK plus circuit delays. When used in the deserializer of FIG. 1, the clock outputs are supplied to the sampler module 111 and the phase control input is supplied by the loop filter module 131.

The digital-to-phase converter includes a first pre-driver module 211 that buffers the in-phase clock inputs ICLK to produce a first pair of complementary buffered clock signals P0, P180. The first pre-driver module 211 produces the first pair of buffered clock signals P0, P180 to have controlled slew rates. A first slew rate control SLEW from a control module 251 controls the slew rates. The slew rates of the first pair of buffered clock signals P0, P180 may be slow relative to the speed of a logic signal. The slew rates may be controlled by variable strength sources and sinks, current digital-to-analog converters, variable capacitors, or variable transistor body biases.

The digital-to-phase converter includes a second pre-driver module 212 that is the same or similar to the first pre-driver module 211. The second pre-driver module 212, however, buffers the quadrature clock inputs QCLK to produce a second pair of complementary buffered clock signals P90, P270 with slew rates based on a second slew rate control SLEW'. The first and second pair of complementary buffered clock signals may be referred to collectively as buffered clock signals with their labels (P0, P90, P180, P270) indicating the relative phase relationships between the buffered clock signals.

The control module 251 may, for example, select the first slew rate control SLEW to be the slowest setting that results in full swings (rail-to-rail) on the pairs of complementary buffered clock signals. Full swing may be approximate, for example, 95% of the supply voltage or the supply voltage minus 50 mV. Full swing on the complementary buffered clock signals avoids uncertainty in the DC (or average) level of the signals. Uncertainty in the signal levels would cause uncertainty in the switching points (timing) of the circuits using the complementary buffered clock signals leading to errors in the phases of the clock outputs. The control module 251 may select the same settings for the first slew rate control SLEW and the second slew rate control SLEW'.

The digital-to-phase converter includes a first mixer module 221 that receives the buffered clock signals and produces the 0-degree clock output Φ0 and the 180-degree clock output Φ180. The first mixer module 221 produces the clock outputs by forming a weighted combination of the buffered clock signals. For example, for a phase control input of the 0°, the 0-degree buffered clock signal P0 is weighted 100% and the other buffered clock signals are weighted 0%; for a phase control input of 90°, the 90-degree buffered clock signal P90 is weighted 100% and the other buffered clock signals weighted 0%; and for a phase control input of 22.5°, the zero-degree buffered clock signal P0 is weighted 75%, the 90-degree buffered clock signal P90 is weighted 25%, and the other buffered clock signals are weighted 0%.

The weighting is based on a first enable control ENABLE from the control module 251. The weighting may be provided by a plurality of mixer cells that each have four enableable inverters having inputs coupled to one of the buffered clock signals and outputs coupled to the first mixer output, with the enableable inverters enabled based on the first enable control ENABLE. The control module 251 produces the first enable control based on the phase control input.

The digital-to-phase converter includes a second mixer module 231 that is the same or similar to the first mixer module 221. The first mixer module 221, however, produces the 90-degree clock output Φ90 and the 270-degree clock output Φ270 based on a second enable control ENABLE' from the control module 251. The second mixer module 231 may differ from the first mixer module 221 in how the buffered clock signals are connected to circuits in the mixer modules For example, circuits that are connected to the 0-degree buffered clock signal P0 in the first mixer module 221 may be connected to the 90-degree buffered clock signal P90 in the second mixer module 231 and circuits that are connected to the 90-degree buffered clock signal P90 in the first mixer module 221 may be connected to the 180-degree buffered clock signal P180 in the second mixer module 231. In this case the first enable control ENABLE and the second enable control ENABLE' may be the same. Alternatively, the same mixer modules and connections may be used for the first mixer module 221 and second mixer module 231 with different enable controls to cause a phase difference between the 0-degree clock output Φ0 and the 90-degree clock output Φ90.

The first mixer module 221 and the second mixer module 231, in the embodiment of FIG. 2, include compensation for nonlinearities in the relationship between the phases of the clock output and the phase control input. The nonlinearity compensation in the mixer modules works to reduce errors in the phase-control relationship. The amount nonlinearity compensation is based on a first nonlinearity control NLCOMP for the first mixer module 221 and a second nonlinearity control NLCOMP' for the second mixer module 231. In an embodiment, the first nonlinearity control NLCOMP and the second nonlinearity NLCOMP may be the same.

The control module 251 supplies controls to the pre-driver modules 211, 212 and the mixer modules 221, 231. The control module 251 receives inputs on which it can base the values of the controls. In the embodiment illustrated in FIG.

2, the control module 251 receives the phase control input PHASE from, for example, the loop filter module 131 of FIG. 1. The control module 251 receives three parametric inputs: a nonlinearity compensation input NLCOMP that signals information about errors in the phase-control relationship; a frequency input FREQ that signals the operating frequency of the input and output clocks of the digital-to-phase converter; and a process-voltage-temperature input PVT that signals circuit speeds. The control module 251 may receive the parametric inputs, for example, from control registers.

The control module 251 supplies the first enable control ENABLE to the first mixer module 221 and the second enable control ENABLE' to the second mixer module 231 based on the phase control input PHASE. For example, the control module 251 may recode binary-coded values on the phase control input PHASE to thermometer-coded values on the enable controls based on how the first mixer module 221 and the second mixer module 231 combine the buffered clock signals to produce the clock outputs.

The control module 251 may supply the first slew rate control SLEW to the first pre-driver module 211 and the second slew rate control SLEW' to the second pre-driver module 212 based on the frequency input FREQ and the process-voltage-temperature input PVT. The control module 251 can set the slew rate controls so that slew rates are slower when the frequency input FREQ signals a lower operating frequency. Similarly, the control module 251 can set the slew rate controls to use slower settings when the process-voltage-temperature input PVT signals faster circuit speeds.

The control module 251 may supply the first nonlinearity control NLCOMP to the first mixer module 221 and the second nonlinearity control NLCOMP' to the second mixer module 231 based on the nonlinearity compensation input NLCOMP. The control module 251 may additionally base the nonlinearity controls on the frequency input FREQ and the process-voltage-temperature input PVT. For example, the control module 251 may increase the amount of compensation when the process-voltage-temperature input PVT signals fast circuit speeds.

In various embodiments, the digital-to-phase converter may omit some or all of the parametric inputs. For example, a digital-to-phase converter that operates at a single frequency (or limited range of frequencies) can omit the frequency input FREQ. Additionally, the performance of some digital-to-phase converters may satisfactory without nonlinearity compensation or process-voltage-temperature compensation.

Many variations on the digital-to-phase converter of FIG. 2 are possible. For example, a digital-to-phase converter may produce only two clock outputs and thus omit the second mixer module 231. Other variations may use different signal polarities, different numbers of the various modules, and different combinations of buffers.

Figure 3:
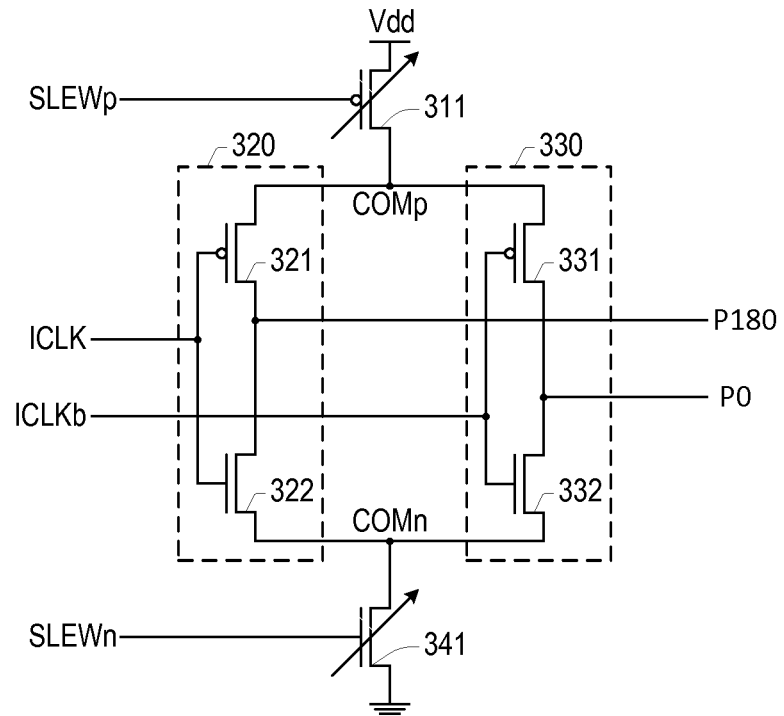
FIG. 3 is a schematic diagram of a pre-driver module according to a presently disclosed embodiment.

FIG. 3 is a schematic diagram of a pre-driver module according to a presently disclosed embodiment. The pre-driver module may be used to implement the first pre-driver module 211 and the second pre-driver module 212 of the digital-to-phase converter of FIG. 2.

The pre-driver module of FIG. 3 receives a pair of complementary clock inputs ICLK, ICLKb (e.g., the in-phase clock inputs ICLK) and produces a pair of complementary clock outputs P0, P180 (e.g., the 0-degree buffered clock signal P0 and the 180-degree buffered clock signal. The inputs and outputs of the pre-driver module are labeled to match the signals of the first pre-driver module 211 of FIG. 2. When the pre-driver module implements the second pre-driver module 212 of FIG. 2, the pair of complementary clock inputs corresponds to the quadrature clock inputs QCLK and the clock outputs correspond to the 90-degree buffered clock signal P90 and the 270-degree buffered clock signal P270. The pre-driver module controls slew rates of rising signals on the clock outputs using a variable strength source 311 and control slew rates of falling signals on the clock output using a variable strength sink 341.

The variable strength source 311 couples a common positive node COMp to a voltage supply Vdd with a strength based on a positive slew rate control SLEWp. The variable strength source 311 may be implemented using a current-mode digital-to-analog converter that sources a current to the common positive node COMp with the magnitude of the current based on the positive slew rate control SLEWp. Alternatively, the variable strength source 311 may be implemented using multiple transistors that are turned on or off based on the positive slew rate control SLEWp.

The variable strength sink 341 is complementary to the variable strength source 311 and couples a common negative node COMn to a ground reference with a strength based on a negative slew rate control SLEWn.

The pre-driver module includes a first inverter 320 (including p-channel transistor 321 and n-channel transistor 322) that inverts the true clock input ICLK to produce the 180-degree clock output P180 and a second inverter 330 (including p-channel transistor 331 and n-channel transistor 332) that inverts the false clock input ICLKb to produce the 0-degree clock output P0. The first inverter 320 and the second inverter 330 are coupled between the variable strength source 311 and the variable strength sink 341.

In a variation of the output buffer, the first inverter 320 and the second inverter 330 are connected to separate variable strength sources and separate variable strength sinks.

Figure 4:
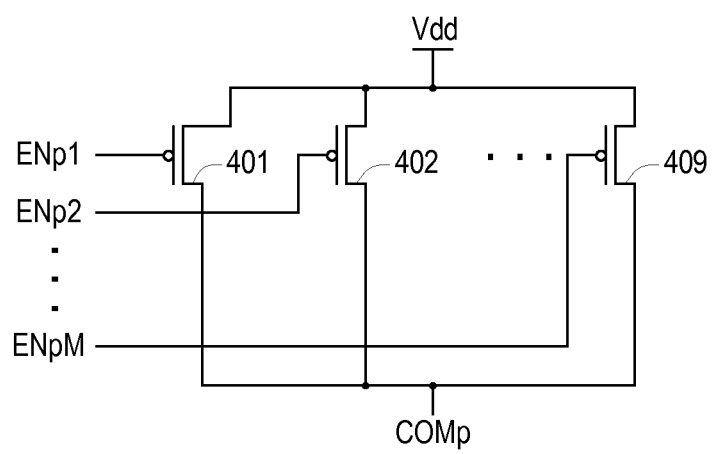
FIG. 4 is a schematic diagram of a variable strength source according to a presently disclosed embodiment.

FIG. 4 is a schematic diagram of a variable strength source according to a presently disclosed embodiment. The variable strength source may be used to implement the variable strength source 311 of the pre-driver module of FIG. 3.

The variable strength source includes a plurality of p-channel transistors 401, 402, ... 409 that have their drains coupled in common to a voltage supply Vdd and their sources coupled in common to a positive common node COMp. Enable controls ENp1, ENp2, ... ENpM switch the p-channel transistors on or off individually. The number of p-channel transistors switched on determines the strength of the source. The strength of the source, when used in a pre-driver module, controls rising slew rates. For example, when three p-channel transistors are turned on, the slew rate is about two-thirds of the slew rate when two p-channel transistors are turned on. The number of p-channel transistors may be chosen based on the range of slew rate control desired in a pre-driver module.

In a variation of the variable strength source, the p-channel transistors 401, 402, ... 409 have different device sizes. In another variation, one or more of the p-channel transistors 401, 402, ... 409 are always on.

The variable strength sink 341 of the pre-driver module of FIG. 3 may be implemented with a circuit complimentary to the variable strength source where the p-channel transistors are replaced with n-channel transistors. The variable strength source 311 and the variable strength sink 341 may have common enable controls.

Figure 5:
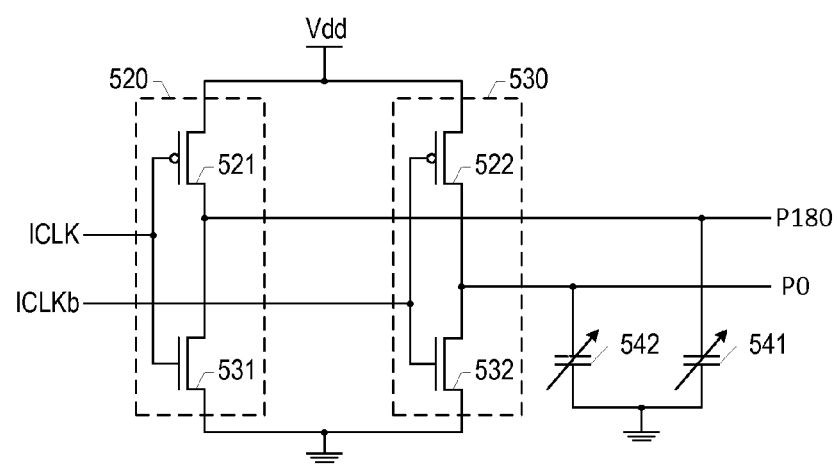
FIG. 5 is a schematic diagram of another pre-driver module according to a presently disclosed embodiment.

FIG. 5 is a schematic diagram of another pre-driver module according to a presently disclosed embodiment. The pre-driver module may be used implement the first pre-driver module 211 and the second pre-driver module 212 of the digital-to-phase converter of FIG. 2.

The pre-driver module of FIG. 5 is similar to the pre-driver module of FIG. 3 but uses variable capacitive loading on the clock outputs to control the slew rates.

The pre-driver module includes a first inverter 520 (including p-channel transistor 521 and n-channel transistor 522) that inverts the true clock input ICLK to produce the 180-degree clock output P180 and a second inverter 530 (including p-channel transistor 531 and n-channel transistor 532) that inverts the false clock input ICLKb to produce the 0-degree clock output P0. The first inverter 520 and the second inverter 530 are coupled between a voltage supply Vdd and a ground reference.

Variable capacitors 541, 542 are coupled to the clock outputs. The slew rates on the outputs increase with increased capacitance. The variable capacitors 541, 542 may be implemented, for example, by coupling or uncoupling multiple capacitors to the outputs.

Figure 6:
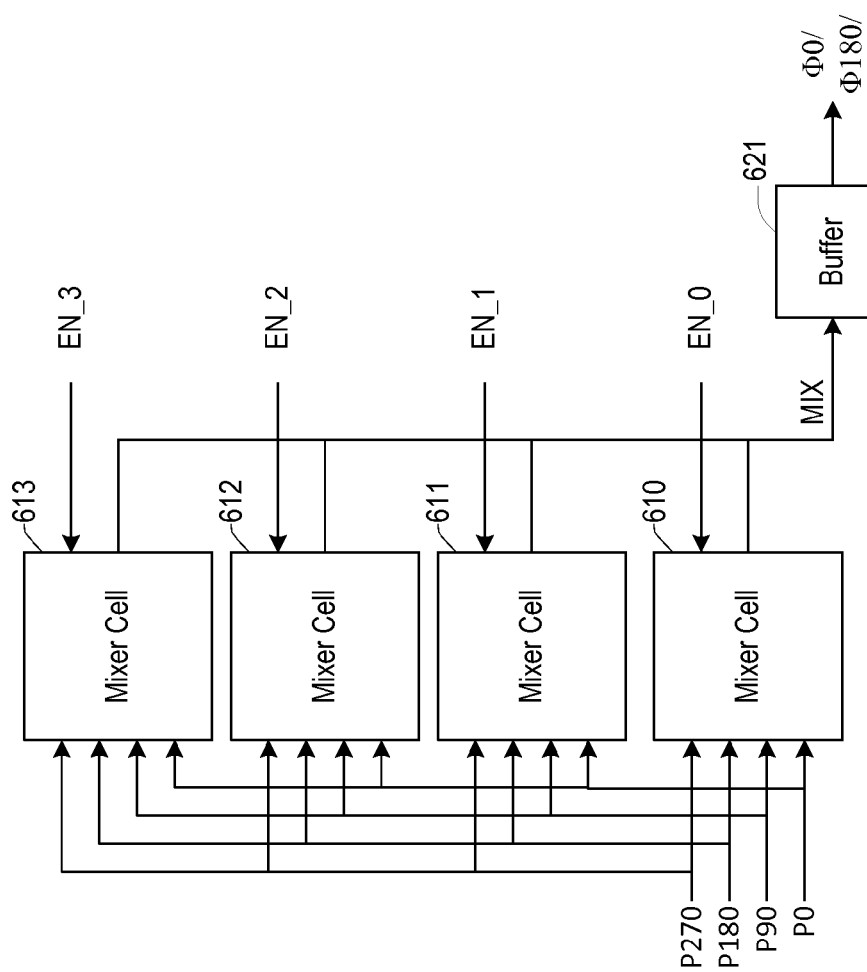
FIG. 6 is a functional block diagram of a mixer module according to a presently disclosed embodiment.

FIG. 6 is a functional block diagram of a mixer module according to a presently disclosed embodiment. The mixer module may be used to implement the first mixer module 221 and the second mixer module 231 of the digital-to-phase converter of FIG. 2.

The mixer module includes for mixer cells 610, 611, 612, 613. Each of the mixer cells receives the buffered clock signals P0, P90, P180, P270 and drives a commonly-connected mixer output MIX. Each mixer cell selectively buffers one of the buffered clock signals to the mixer output MIX based on enable controls EN_0, EN_1, EN_2, EN_3. An output buffer 621 buffers the mixer output MIX to produce the 0-degree clock output Φ0 and the 180-degree clock output Φ180. The outputs of the mixer module are labeled to match the signals of the first mixer module 221 of FIG. 2. When the mixer module implements the second mixer module 231 of FIG. 2, the output buffer 621 drives the 90-degree clock output Φ90 and the 270-degree clock output Φ270. The output buffer 621, as illustrated in FIG. 6, may convert a single-ended signal to differential (complementary) signals.

The enable controls determine the phase of the clock outputs. The control module 251 may, for example, decode the enable controls from the phase control input. With four mixer cells, the mixer module can produce the clock output at 16 different phases (4 phases in each quadrant).

In an example embodiment, for a zeroth phase, each mixer cell buffers the 0-degree buffered clock signal to the mixer output MIX and the phase of the 0-degree clock output Φ0 corresponds (with circuit delays) to the phase of the 0-degree buffered clock signal P0.

For a first phase setting, three mixer cells buffer the 0-degree buffered clock signal P0 and one mixer cell buffers the 90-degree buffered clock signal P90 to the mixer output MIX. This results in the phase of the clock output lagging the phase of the zeroth phase setting by 22.5° (one-quarter of 90°).

For a second phase setting, two mixer cells buffer the 0-degree buffered clock signal P0 and two mixer cells buffer the 90-degree buffered clock signal P90 to the mixer output MIX. This results in the phase of the clock output lagging the phase of the zeroth phase setting by 45° (one-half of 90°).

For a third phase setting, one mixer cell buffers the 0-degree buffered clock signal P0 and three mixer cells buffer the 90-degree buffered clock signal P90 to the mixer output MIX. This results in the phase of the clock output lagging the phase of the zeroth phase setting by 67.5° (three-fourths of 90°).

For a fourth phase setting, each mixer cell buffers the 90-degree buffered clock signal to the mixer output MIX and the phase of the clock output lags the phase of the zeroth phase setting by 90° corresponding (with circuit delays) to the phase of the 90-degree buffered clock signal P90.

Fifth through fifteenth phase settings produces the clock output with its phase in the second, third, and fourth quadrants.

Other numbers of mixer cells may also be used. For example, an embodiment may use 16 mixer cells to produce 64 different phase settings.

Figure 7:
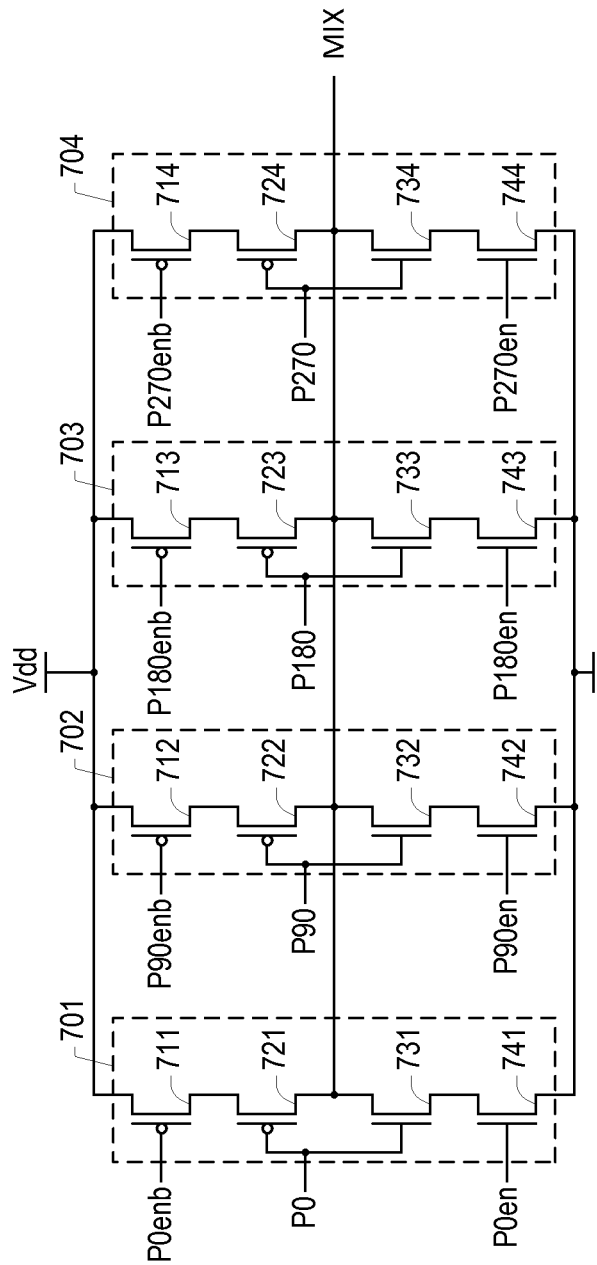
FIG. 7 is a schematic diagram of a mixer cell according to a presently disclosed embodiment.

FIG. 7 is a schematic diagram of a mixer cell according to a presently disclosed embodiment. The mixer cell may be used to implement the mixer cells 610, 611, 612, 613 of the mixer module of FIG. 6.

The mixer cell of FIG. 7 uses enableable inverters to selectively buffer one of the buffered clock signals to the mixer output MIX. Accordingly, the mixer cell may be used with an inverting output buffer. Alternatively, connections to the input or output signals may be altered to affect a 180° phase shift.

The mixer cell includes four enableable inverters 701, 702, 703, 704. Each of the enableable inverters may be the same or similar but with different input connections. The first enableable inverter 701 selectively buffers the 0-degree buffered clock signal P0 to the mixer output MIX and is enabled by enable controls P0en, P0enb. The first enableable inverter 701 includes p-channel transistor 711 and p-channel transistor 721 coupled in series between a voltage supply Vdd and the mixer output and n-channel transistor 731 and n-channel transistor 741 coupled in series between a ground reference and the mixer output. The first enableable inverter 701 is enabled by the complementary enable controls P0en, P0enb coupled to the gates of n-channel transistor 741 and p-channel transistor 711. The 0-degree buffered clock signal P0 is coupled to the gates of n-channel transistor 731 and p-channel transistor 721.

The second enableable inverter 702 (including p-channel transistor 712, p-channel transistor 722, n-channel transistor 732, and n-channel transistor 742) selectively buffers the 90-degree buffered clock signal P90 to the mixer output MIX and is enabled by enable controls P90en, P90enb.

The third enableable inverter 703 (including p-channel transistor 713, p-channel transistor 723, n-channel transistor 733, and n-channel transistor 743) selectively buffers the 180-degree buffered clock signal P180 to the mixer output MIX and is enabled by enable controls P180en, P180enb.

The second enableable inverter 704 (including p-channel transistor 714, p-channel transistor 724, n-channel transistor 734, and n-channel transistor 744) selectively buffers the 270-degree buffered clock signal P270 to the mixer output MIX and is enabled by enable controls P270en, P270enb.

The transistors in the enableable inverters may use the same types of transistors that are used to perform form in general logic Gates.

Figure 8:
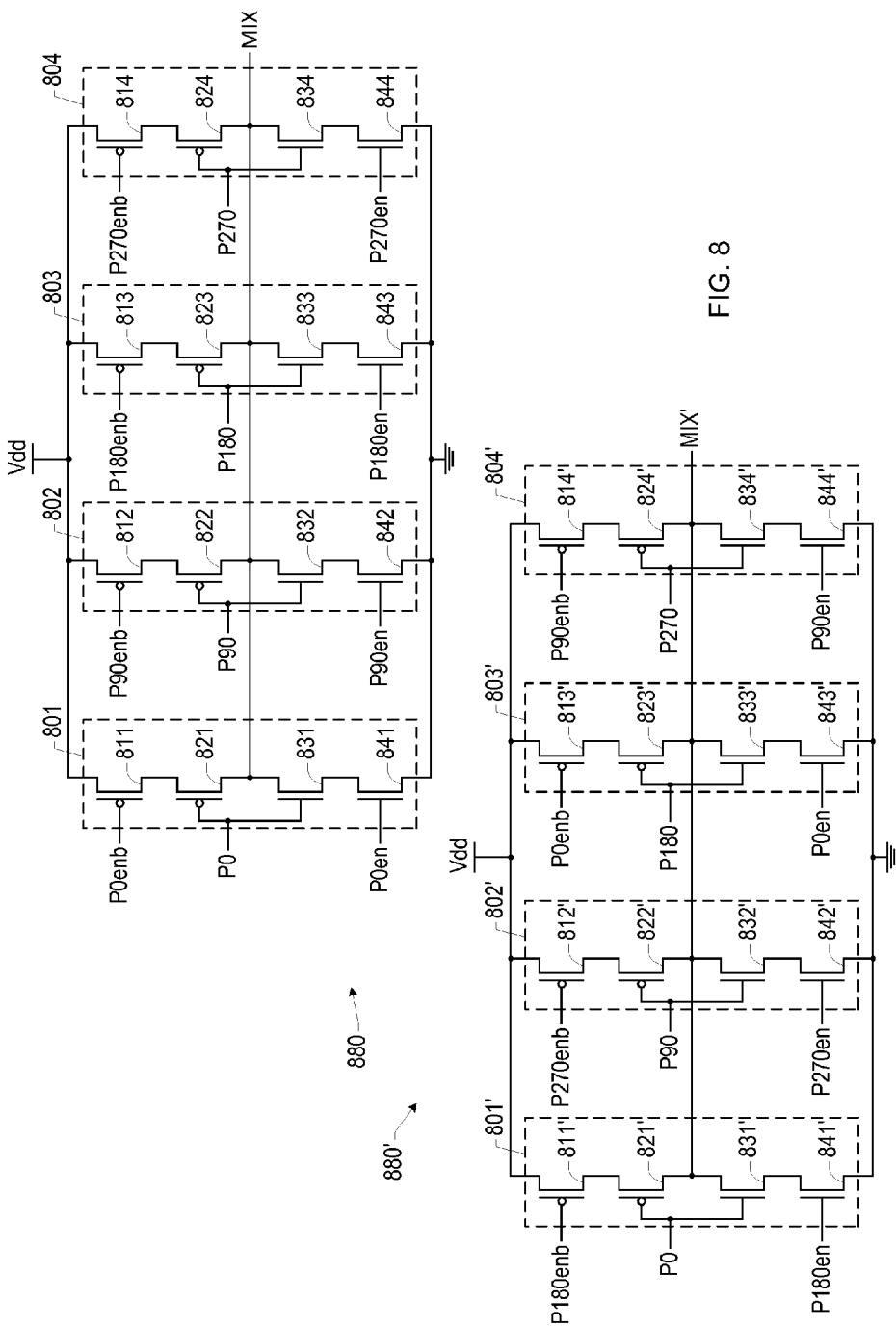
FIG. 8 is a schematic diagram of another mixer cell according to a presently disclosed embodiment.

FIG. 8 is a schematic diagram of another mixer cell according to a presently disclosed embodiment. The mixer cell is similar to the mixer cell of FIG. 7, but the mixer cell of FIG. 8 produces complementary outputs.

The mixer cell includes a first mixer sub-cell 880 that corresponds to the mixer cell of FIG. 7 and a second mixer sub-cell 880' that produces a complementary output MIX'. Note that the connections to the enableable inverters rotate by 180 degrees between the first and second mixer sub-cells.

For example, the first enableable converter 801 in the first mixer sub-cell 880 that selectively buffers the 0-degree buffered clock signal P0 is enabled by enable controls P0en, P0enb, whereas the first enableable converter 801' in the second mixer sub-cell 880' that also selectively buffers the 0-degree buffered clock signal P0 is enabled by enable controls P180en, P180enb.

Figure 9:
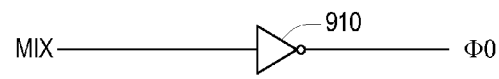
FIG. 9 is a schematic diagram of an output buffer according to a presently disclosed embodiment.

FIG. 9 is a schematic diagram of an output buffer according to a presently disclosed embodiment. The output buffer may implement the output buffer 621 of the mixer module of FIG. 6.

The output buffer of FIG. 9 includes an inverter 910 that drives clock output Φ0 based on input MIX. Since the output buffer is inverting, it can be used with the mixer cells of FIG. 7 and FIG. 8, which are also inverting. When we used with the mixer cell of FIG. 8, two output buffers may be used (one buffering MIX and one buffering (MIX')).

Figure 10:
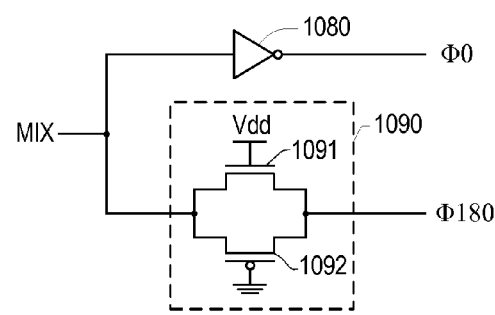
FIG. 10 is a schematic diagram of another output buffer according to a presently disclosed embodiment.

FIG. 10 is a schematic diagram of another output buffer according to a presently disclosed embodiment. The output buffer may implement the output buffer 621 of the mixer module of FIG. 6.

The output buffer of FIG. 9 produces complementary (differential) clock outputs Φ0, Φ180 from input MIX. The output buffer includes an inverter 1080 that drives the positive clock output Φ0 based on input MIX and a pass gate 1090 drives the negative clock output Φ180 from the input MIX. The pass gate 1090 includes an re-channel transistor 1091 and a p-channel transistor 1092 coupled between the input MIX and the negative clock output Φ180. The gate of n-channel transistor 1091 is coupled to a voltage supply Vdd and the gate of p-channel transistor 1092 is coupled to a ground reference so that both transistors are on.

The inverter 1080 and the pass gate 1090 produce the same or similar delays from the input MIX to both clock outputs Φ0, Φ180. Since the output buffer converts from single-ended to differential signals, it can be used with the mixer cell of FIG. 7, which produces a single-ended output. Various embodiments may include additional buffers (e.g., inverters) on the input and the outputs.

Figure 11:
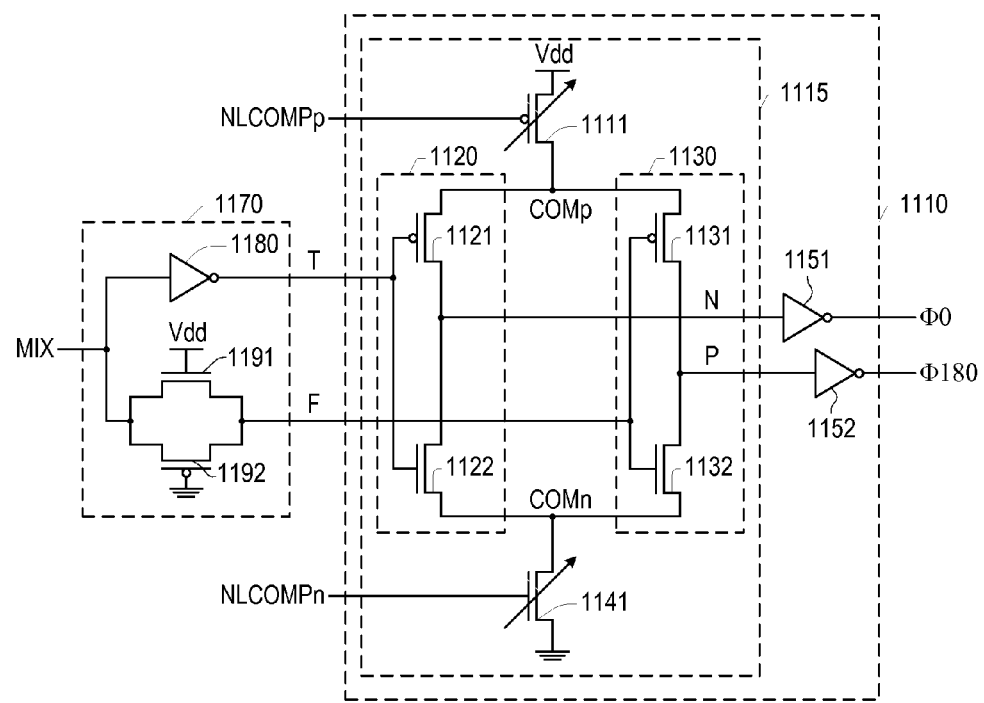
FIG. 11 is a schematic diagram of another output buffer according to a presently disclosed embodiment.

FIG. 11 is a schematic diagram of another output buffer according to a presently disclosed embodiment. The output buffer may implement the output buffer 621 of the mixer module of FIG. 6. The output buffer of FIG. 11 can be used in a digital-to-phase converter to compensate for nonlinearities in the relationship between phases of the clock output and the phase control input.

The output buffer of FIG. 11 is similar to the output buffer of FIG. 10 and produces complementary (differential) clock outputs Φ0, Φ180 from input MIX. The output buffer includes a single-ended to differential converter 1170 that receives the input MIX and produces positive buffered signal T and negative buffered signal F. The single-ended to differential converter 1170 may the same or similar to the output buffer of FIG. 9 and includes an inverter 1180, an n-channel transistor 1191, and a p-channel transistor 1192.

The output buffer includes a delay adjustment circuit 1110. Adjusting delays in the output buffer can compensate for nonlinearities in the relationship between phases of the clock output and the phase control input in a digital-to-phase converter. For example, the output buffer can compensate for a phase error of 1% in a 1 GHz clock output of the digital-to-phase converter with a 10 ps delay change. The delay adjustment circuit 1110 adjusts delays for falling edges on the clock outputs based on a p-type nonlinearity control NLCOMPp and adjusts delays for rising edges on the clock outputs based on a n-type nonlinearity control NLCOMPn.

In the embodiment of FIG. 11, the delay adjustment circuit 1110 uses slew-rate control buffer 1115 to adjust delays. When the slew-rate control buffer 1115 changes slew rates on corrected outputs P, N, the delays through the output buffer change correspondingly.

In various embodiments, the slew-rate control buffer 1115 may be same or similar to the pre-driver module of FIG. 3. The slew-rate control buffer 1115 controls slew rates of rising signals on the corrected outputs P, N using a variable strength source 1111 and control slew rates of falling signals on the buffer outputs P, N using a variable strength sink 1141.

The variable strength source 1111 couples a common positive node COMp to a voltage supply Vdd with a strength based on the p-type nonlinearity control NLCOMPp. The variable strength source 1111 may be implemented, for example, using a current-mode digital-to-analog converter or using multiple transistors that are turned on or off The variable strength sink 1141 is complementary to the variable strength source 1111 and couples a common negative node COMn to a ground reference with a strength based on the n-type nonlinearity control NLCOMPn.

The slew-rate control buffer 1115 includes a first inverter 1120 (including p-channel transistor 1121 and n-channel transistor 1122) that inverts the positive buffered signal T to produce the negative buffer output N and a second inverter 1130 (including p-channel transistor 1131 and n-channel transistor 1132) that inverts the negative buffered signal F to produce the positive buffer output P. The first inverter 1120 and the second inverter 1130 are coupled between the variable strength source 1111 and the variable strength sink 1141.

The delay adjustment circuit 1110 also includes a third inverter 1151 that buffers the negative buffer output N to drive clock output Φ0 and a fourth inverter 1152 that buffers the positive buffer output P to drive clock output Φ180.

The delay adjustment circuit 1110 may by implemented using other techniques, for example, using variable capacitors or variable body biases.

Figure 12:
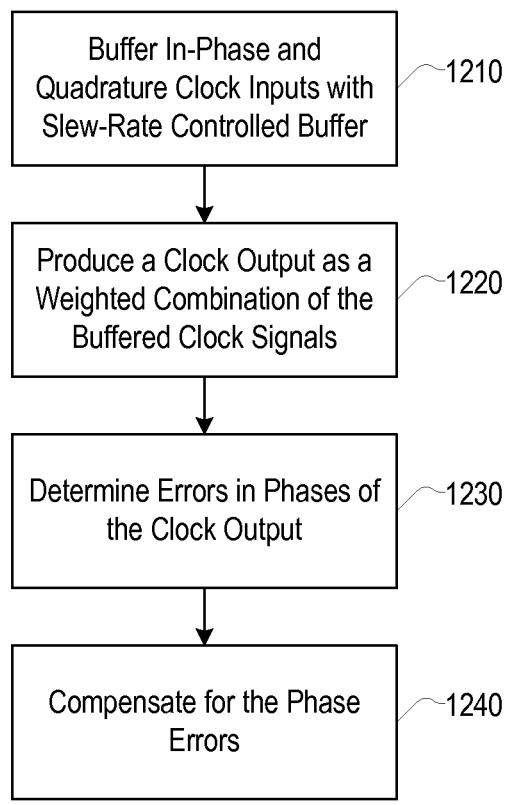
FIG. 12 is a flowchart of a process for digital-to-phase conversion according to a presently disclosed embodiment.

FIG. 12 is a flowchart of a process for digital-to-phase conversion according to a presently disclosed embodiment. The process will be described with reference to the digital-to-phase converter of FIG. 2; however, various embodiments of the process may be applied to any suitable apparatus.

In block 1210, the pre-driver modules 211, 212 receive complementary in-phase clock signals and complementary quadrature clock signals and produce the buffered clock signals P0, P90, P180, P270 with controlled edge slew rates. The slew rates may be controlled, for example, based on information as described with reference to the control module 251.

In block 1220, the mixer modules 221, 231 form weighted combinations of the buffered clock signals P0, P90, P180, P270 to produce the clock outputs Φ0, Φ90, Φ180, Φ270 based on the phase control input.

In block 1230, the process determines errors in the actual versus expected relationship between the phases of the clock output and the phase control input. These errors may be referred to as nonlinearities since the expected relationship is a linear one. The process may determine the errors, for example, by measurements made in an integrated circuit that includes the digital-to-phase converter, by measurements made during manufacturing of the digital-to-phase converter, by measurements made during characterization of the digital-to-phase converter, or by measurements made during design of the digital-to-phase converter. Errors in the phase-control relationship in mixer modules (and phase interpolators) tend to be zero (or very small) at 0, 90, 180, and 270 degrees, with the largest errors at 45, 135, 225, and 315 degrees. Accordingly, the process may measure only the largest errors with other errors estimated, for example, by interpolation.

In block 1240, the process compensates for the phase errors determined in block 1230. For example, the output buffer of FIG. 11 may compensate for the phase errors. The process may use a table of compensation versus phase control values to determine the amount of compensation. The table values may vary, for example, with operating frequency, voltage, and other parameters. The number of different table values may be reduced depending on the nature of the errors. For example, the process may compensate only for the largest phase errors.

The process of FIG. 12 may be modified, for example, by adding or altering steps. Additionally, steps may be performed concurrently.

The presently disclosed digital-to-phase converters may have several advantages over prior present digital-to-phase converters. The present digital-to-phase converters may operate with less power and occupy less integrated circuit area than prior digital-to-phase converters. The present digital-to-phase converters receive and produce CMOS signals. Thus, signal converters (e.g., to and from CML levels) are not needed. The present digital-to-phase converters use CMOS circuits that scale similarly to other logic circuits. Additionally, the present digital-to-phase converters use CMOS circuits may be instantiated in an integrated circuit with few placement limitations.

The present digital-to-phase converters may provide improved performance over prior digital-to-phase converters. For example, the present digital-to-phase converters may compensate for process, voltage, and temperature variations so that performance variations due to changes in those conditions are reduced or eliminated. Additionally, the present digital-to-phase converters may provide improved linearity between the phase control and the phase of the sampling clock signals. Improved performance may, for example, result in fewer errors in recovered data when the digital-to-phase converters are used in clock and data recovery circuits.

Although embodiments of the invention are described above for particular embodiments, many variations of the invention are possible, including, for example, those with different signal polarities and transistor types. Some functions may be deleted. Furthermore, functions described as being performed by one module may be moved to another module or distributed across modules. Other variations may produce a different number of clock signals, for example, eight clock signals spaced by 45 degrees. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A digital-to-phase converter circuit for producing a clock output having a digitally controlled phase, the circuit comprising:
    a first pre-driver module configured to receive complementary in-phase clock signals and produce a first pair of complementary buffered clock signals having controlled slew rates;
    a second pre-driver module configured to receive complementary quadrature clock signals and produce a second pair of complementary buffered clock signals having controlled slew rates; and
    a mixer module configured to produce the clock output by forming a weighted combination of the buffered clock signals based on a phase control input, the mixer module comprising
        a plurality of mixer cells, each of the plurality of mixer cells comprising four enableable inverters, each of the four enableable inverters having an input coupled to one of the buffered clock signals and an output coupled to a first mixer output, wherein one of the enableable inverters is enabled based on the phase control input; and
        an output buffer configured to buffer the first mixer output to produce the clock output.

2. The circuit of claim 1, wherein the controlled slew rates are controlled to produce full swings on the first pair of complementary buffered clock signals and the second pair of complementary buffered clock signals.

3. The circuit of claim 1, wherein the first pre-driver module comprises:
    a variable strength current source configured to control rising slew rates of the first pair of complementary buffered clock signals;
    a variable strength current sink configured to control falling slew rates of the first pair of complementary buffered clock signals;
    a first inverter coupled between the variable strength current source and the variable strength current sink and receiving one of the complementary in-phase clock signals and producing one of the first pair of complementary buffered clock signals; and
    a second inverter coupled between the variable strength current source and the variable strength current sink and receiving the other one of the complementary in-phase clock signals and producing the other one of the first pair of complementary buffered clock signals.

4. The circuit of claim 1, wherein each of the four enableable inverters includes:
    a first p-channel transistor and a second p-channel transistor coupled in series between a voltage supply and the first mixer output, wherein the first p-channel transistor has a gate connected to the respective one of the buffered clock signals; and
    a first n-channel transistor and a second n-channel transistor coupled in series between a ground reference and the first mixer output, wherein the first n-channel transistor has a gate connected to the respective one of the buffered clock signals.

5. The circuit of claim 1, wherein the output buffer is further configured to correct for nonlinearities in a relationship between the phase of the first mixer output and the phase control input.

6. The circuit of claim 5, wherein the output buffer comprises:
- a variable strength source having a strength configured to correct for nonlinearities between the phase of the first mixer output and the phase control input;
- a variable strength sink having a strength configured to correct for nonlinearities between the phase of the first mixer output and the phase control input;
- a first inverter coupled between the variable strength source and the variable strength sink having an input coupled to the first mixer output and an output coupled to a first corrected output; and
- a second inverter having an input coupled to the first corrected output and an output coupled to the clock output.

7. The circuit of claim 5, wherein the output buffer configured to receive the first mixer output and produce complementary outputs, and wherein the output buffer comprises:
- a variable strength source having a strength configured to correct for nonlinearities between the phase of the first mixer output and the phase control input;
- a variable strength sink having a strength configured to correct for nonlinearities between the phase of the first mixer output and the phase control input;
- a first inverter coupled between the variable strength source and the variable strength sink having an input coupled to a complement of the first mixer output and an output coupled to a first corrected output;
- a second inverter coupled between the variable strength source and the variable strength sink having an input coupled to the first mixer output and an output coupled to a second corrected output;
- a third inverter having an input coupled to the first corrected output and an output coupled to one of the complementary outputs; and
- a fourth inverter having an input coupled to the second corrected output and an output coupled to the other one of the complementary outputs.

8. The circuit of claim 1, further comprising a control module configured to control the slew rates of the first pre-driver module and the second pre-driver module based on one or more of fabrication process conditions, supply voltage, temperature, and operating frequency.

9. The circuit of claim 1, further comprising a second mixer module configured to produce a second clock output by forming a second weighted combination of the buffered clock signals based on the phase control input.

10. A method for producing a clock output having a digitally controlled phase, the method comprising:
- buffering in-phase clock signals to produce a first pair of complementary buffered clock signals having controlled slew rates based on one or more of fabrication process conditions, supply voltage, temperature, and operating frequency;
- buffering quadrature clock signals to produce a second pair of complementary buffered clock signals having controlled slew rates based on one or more of fabrication process conditions, supply voltage, temperature, and operating frequency; and
- forming a weighted combination of the buffered clock signals to produce the clock output, wherein the weighted combination is selected to produce the digitally controlled phase.

11. The method of claim 10, wherein the controlled slew rates are controlled to produce full swings on the first pair of complementary buffered clock signals and the second pair of complementary buffered clock signals.

12. The method of claim 10, wherein buffing the in-phase clock signals to produce the first pair of complementary buffered clock signals utilizes a variable strength source to control rising slew rates of the first pair of complementary buffered clock signals and a variable strength sink to control falling slew rates of the first pair of complementary buffered clock signals.

13. The method of claim 10, further comprising correcting for nonlinearities in a relationship between the phase of the clock output and the digitally controlled phase.

14. The method of claim 13, wherein correcting for nonlinearities in the relationship between the phase of the clock output and the digitally controlled phase includes controlling a delay in buffer driving the clock output.

15. The method of claim 10, further comprising forming a second weighted combination of the buffered clock signals to produce a second clock output.

16. An apparatus for producing a clock output having a digitally controlled phase, the apparatus including:
- a means for driving a first pair of complementary buffered clock signals configured to receive complementary in-phase clock signals and produce the first pair of complementary buffered clock signals having controlled slew rates;
- a means for driving a second pair of complementary buffered clock signals configured to receive complementary quadrature clock signals and produce the second pair of complementary buffered clock signals having controlled slew rates; and
- a means for mixing configured to produce the clock output by forming a weighted combination of the buffered clock signals based on a phase control input, the means for mixing comprising
    - a plurality of mixer cells, each of the plurality of mixer cells comprising four enableable inverters, each of the four enableable inverters having an input coupled to one of the buffered clock signals and an output coupled to a first mixer output, wherein one of the enableable inverters is enabled based on the phase control input; and
    - an output buffer configured to buffer the first mixer output to produce the clock output.

17. The apparatus of claim 16, wherein the controlled slew rates are controlled to produce full swings on the first pair of complementary buffered clock signals and the second pair of complementary buffered clock signals.

18. The apparatus of claim 16, wherein the means for driving the first pair of complementary buffered clock signals comprises:
- a variable strength current source configured to control rising slew rates of the first pair of complementary buffered clock signals;
- a variable strength current sink configured to control falling slew rates of the first pair of complementary buffered clock signals;
- a first inverter coupled between the variable strength current source and the variable strength current sink and receiving one of the complementary in-phase clock signals and producing one of the first pair of complementary buffered clock signals; and
- a second inverter coupled between the variable strength current source and the variable strength current sink and receiving the other one of the complementary in-phase clock signals and producing the other one of the first pair of complementary buffered clock signals.

19. The apparatus of claim 16, wherein each of the four enableable inverters includes:
- a first p-channel transistor and a second p-channel transistor coupled in series between a voltage supply and the first mixer output, wherein the first p-channel transistor has a gate connected to the respective one of the buffered clock signals; and
- a first n-channel transistor and a second n-channel transistor coupled in series between a ground reference and the first mixer output, wherein the first n-channel transistor has a gate connected to the respective one of the buffered clock signals.

20. The apparatus of claim 16, wherein the output buffer is further configured to correct for nonlinearities in a relationship between the phase of the first mixer output and the phase control input.

21. The apparatus of claim 20, wherein the output buffer comprises:
- a variable strength source having a strength configured to correct for nonlinearities between the phase of the first mixer output and the phase control input;
- a variable strength sink having a strength configured to correct for nonlinearities between the phase of the first mixer output and the phase control input;
- a first inverter coupled between the variable strength source and the variable strength sink having an input coupled to the first mixer output and an output coupled to a first corrected output; and
- a second inverter having an input coupled to the first corrected output and an output coupled to the clock output.

22. The apparatus of claim 20, wherein the output buffer configured to receive the first mixer output and produce complementary digital-to-phase converter outputs, and wherein the output buffer comprises:
- a variable strength source having a strength configured to correct for nonlinearities between the phase of the first mixer output and the phase control input;
- a variable strength sink having a strength configured to correct for nonlinearities between the phase of the first mixer output and the phase control input;
- a first inverter coupled between the variable strength source and the variable strength sink having an input coupled to a complement of the first mixer output and an output coupled to a first corrected output;
- a second inverter coupled between the variable strength source and the variable strength sink having an input coupled to the first mixer output and an output coupled to a second corrected output;
- a third inverter having an input coupled to the first corrected output and an output coupled to one of the complementary digital-to-phase converter outputs; and
- a fourth inverter having an input coupled to the second corrected output and an output coupled to the other one of the complementary digital-to-phase converter outputs.

23. The apparatus of claim 16, further comprising a control module configured to control the slew rates of the means for driving the first pair of complementary buffered clock signals and the means for driving the second pair of complementary buffered clock signals based on one more of fabrication process conditions, supply voltage, temperature, and operating frequency.

24. The apparatus of claim 16, further comprising a second means for mixing configured to produce a second clock output by forming a second weighted combination of the buffered clock signals based on the phase control input.

* * * * *